United States Patent
Hashimoto et al.

(10) Patent No.: US 8,304,310 B2
(45) Date of Patent: Nov. 6, 2012

(54) MANUFACTURE METHOD OF SEMICONDUCTOR DEVICE

(75) Inventors: Hiroshi Hashimoto, Kawasaki (JP); Kazuhiko Takada, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/026,736

(22) Filed: Feb. 14, 2011

(65) Prior Publication Data

US 2011/0136312 A1 Jun. 9, 2011

Related U.S. Application Data

(60) Division of application No. 12/640,067, filed on Dec. 17, 2008, now abandoned, which is a division of application No. 11/145,214, filed on Jun. 6, 2005, now abandoned, which is a continuation of application No. PCT/JP03/03382, filed on Mar. 19, 2003.

(51) Int. Cl.
*H01L 21/336* (2006.01)

(52) U.S. Cl. .. 438/257; 438/258; 438/275; 257/E21.421

(58) Field of Classification Search .................. 438/201, 438/211, 257, 258, 265, 275; 257/E21.179, 257/E21.421
See application file for complete search history.

(56) References Cited

U.S. PATENT DOCUMENTS

| | | | |
|---|---|---|---|
| 4,635,347 A | 1/1987 | Lien et al. | |
| 4,651,406 A | 3/1987 | Shimizu et al. | |
| 4,775,642 A | 10/1988 | Chang et al. | |
| 5,789,294 A | 8/1998 | Choi | |
| 5,976,934 A | * 11/1999 | Hayakawa | 438/258 |
| 6,235,574 B1 | 5/2001 | Tobben et al. | |
| 6,274,430 B1 | 8/2001 | Jan et al. | |
| 6,294,430 B1 | 9/2001 | Fastow et al. | |
| 6,417,051 B1 | 7/2002 | Takebuchi | |
| 6,417,086 B1 | 7/2002 | Osari | |
| 6,448,136 B1 | 9/2002 | Chang et al. | |

(Continued)

FOREIGN PATENT DOCUMENTS

EP 1274132 A2 * 1/2003

(Continued)

OTHER PUBLICATIONS

Japanese Office Action dated Jun. 30, 2009 issued in corresponding Japanese patent Application No. 2004-569583 (w/partial translation).

(Continued)

*Primary Examiner* — Tuan N. Quach
(74) *Attorney, Agent, or Firm* — Westerman, Hattori, Daniels & Adrian, LLP

(57) ABSTRACT

The disclosure pertains to a semiconductor device and its manufacture method, the semiconductor device including non-volatile memory cells and a peripheral circuit including field effect transistors having an insulated gate. A semiconductor device and its manufacture method are to be provided, the semiconductor device having memory cells with a high retention ability and field effect transistors having an insulated gate with large drive current. The semiconductor device has a semiconductor substrate (1) having first and second areas (AR1, AR2), a floating gate structure (4, 5, 6, 7, 8) for a non-volatile memory cell, a control gate structure (14) formed coupled to the floating gate structure, formed in the first area, and an insulated gate electrode (12, 14) for a logical circuit formed in the second area, wherein the floating gate structure has bird's beaks larger than those of the insulated gate electrode.

9 Claims, 18 Drawing Sheets

U.S. PATENT DOCUMENTS

| | | |
|---|---|---|
| 6,794,708 B2 | 9/2004 | Mori |
| 7,538,376 B2 * | 5/2009 | Hashimoto et al. ........... 257/314 |
| 2001/0025981 A1 | 10/2001 | Yoo et al. |
| 2002/0033501 A1 | 3/2002 | Sakagami |
| 2003/0008458 A1 * | 1/2003 | Hashimoto et al. ........... 438/258 |

FOREIGN PATENT DOCUMENTS

| | | |
|---|---|---|
| JP | 3-214777 A | 9/1991 |
| JP | 05-343703 A | 12/1993 |
| JP | 08-264738 A | 10/1996 |
| JP | 10-154802 A | 6/1998 |
| JP | 10-223782 A | 8/1998 |
| JP | 11-054637 A | 2/1999 |
| JP | 2000-243937 A | 9/2000 |
| JP | 2000-311991 A | 11/2000 |
| JP | 2000-340773 A | 12/2000 |
| JP | 2002-100686 A | 4/2002 |
| JP | 2002-520807 A | 7/2002 |
| JP | 2003-017596 A | 1/2003 |
| JP | 2003-031705 A | 1/2003 |
| WO | 99/57766 A1 | 11/1999 |

OTHER PUBLICATIONS

Japanese Office Action dated Feb. 24, 2009 issued in corresponding Japanese Application No. 2004-569583 (w/ partial translation).

Korean Office Action dated May 25, 2006 issued in corresponding Korean Application No. 10-2005-7005071.

Japanese Office Action issued in Nov. 18, 2008 in corresponding Japanese Patent Application No. 2004-569583 (w/partial translation).

International Search Report in Application PCT/JP03/03382 dated Jul. 1, 2003.

* cited by examiner

MANUFACTURE METHOD OF SEMICONDUCTOR DEVICE

CROSS REFERENCE TO RELATED APPLICATION

This application is a Divisional Application of U.S. Ser. No. 12/640,067, filed Dec. 17, 2009 now abandoned, which is a Divisional Application of U.S. Ser. No. 11/145,214, filed Jun. 6, 2005 now abandoned, which is a Continuation Application of PCT/JP03/03382 filed on Mar. 19, 2003, the entire contents of which b incorporated herein by reference.

BACKGROUND OF THE INVENTION

A) Field of the Invention

The present invention relates to a semiconductor device, and its manufacture method, and more particularly to a semiconductor device having a memory circuit of, for example, non-volatile memory cell transistors and a peripheral circuit of logical cell transistors, and to its manufacture method.

B) Description of the Related Art

Known as the structure of an electrically erasable non-volatile memory, is a structure having a lamination of a floating gate structure having a charge retention function and a control gate structure for applying an electric field to a channel via the floating gate structure, stacked on a semiconductor region formed with the channel. The floating gate structure includes a silicon layer insulated with an insulating layer or layers, or a lamination of an oxide film, a nitride film and an oxide film, forming a nitride film interface having a charge storage function.

Programming (data write) is performed by selectively injecting electrons into the floating gate. When a predetermined voltage is applied to the control gate structure, the conductivity of a channel below the floating gate changes, depending on whether or not there are charges in the floating gate structure. Hence, written information can be read. By draining electrons from the floating gate structure, written information can be erased.

It is preferable to cover the side walls of the floating gate structure with an insulating film of good quality, in order to reduce leak of charges written in the floating gate structure. For example, a floating electrode is formed by a silicon layer sandwiched between insulating layers, and side walls are thermally oxidized. A floating gate electrode covered with an insulating film of good quality such as a thermally oxidized film improves the charge retention performance. The charge retention performance of a floating gate structure made of a lamination of oxide film-nitride film-oxide film can also be improved by covering the side walls with an oxide film or the like.

A semiconductor integrated circuit such as a system LSI of high integration degree is structured having a plurality type of semiconductor elements such as non-volatile memories, high voltage insulated gate field effect (abbreviated to MOS) transistors for driving them and low voltage MOS transistors for logical circuits. A logical circuit low voltage MOS transistor has a short gate length and a thin gate insulating film in order to raise its operation speed.

Manufacture processes for a semiconductor integrated circuit are designed to use in common as many same processes as possible for the manufacture of a plurality type of semiconductor elements. For example, the gate electrode of a MOS transistor is made of the same silicon layer as that of the control gate electrode of a non-volatile memory cell.

In the process of thermally oxidizing the side walls of a floating gate electrode, the side walls of the gate electrode of a MOS transistor are also thermally oxidized. During the thermally oxidizing process, oxidizing species enter the interface between a silicon substrate and an upper insulating film and the interface between a silicon layer and an insulating film so that an oxidized region called a bird's beak is formed.

A low voltage MOS transistor has a short gate length and a thin gate insulating film. As a birds' beak is formed at the edge portions of a gate insulating film, the gate insulating film becomes thick under the edge portions of the gate electrode so that a drive current of the MOS transistor is lowered.

A laminated gate structure of a non-volatile memory cell and a single layer gate structure of a MOS transistor are patterned by using different masks and different processes. Therefore, mask alignment margins are increased. If a first mask alignment margin is 0.2 μm, a second mask alignment margin is increased to 0.28 μm. An increase in the mask alignment margin hinders high integration.

Japanese Patent Laid-open Publication No. HEI-10-223782 proposes a non-volatile memory cell whose control gate electrode is made of a diffusion region in a substrate. A low resistance region functioning as a control gate electrode is formed in a semiconductor substrate, and a floating gate electrode is formed extending from an area above a channel region of the memory transistor to an area above the low resistance region functioning as the control gate electrode. The control gate electrode can be formed by the same process as that for the source/drain regions of the memory transistor, so that the manufacture processes for a non-volatile memory can be simplified.

SUMMARY OF THE INVENTION

An object of the present invention is to provide a semiconductor device having memory cells with a high data retention ability and field effect transistors having an insulating film realizing a high drive current.

Another object of the present invention is to provide a semiconductor device capable of enhancing a data retention ability of a non-volatile memory cell and preventing lowering of the drive current of a field effect transistor having an insulated gate in a logical circuit.

Another object of the present invention is to provide a method of manufacturing the semiconductor device as described above.

Another object of the present invention is to provide a method of manufacturing at a high precision the semiconductor device as described above.

Still another object of the present invention is to provide a method of manufacturing efficiently the semiconductor device as described above.

According to one aspect of the present invention, there is provided a semiconductor device comprising: a semiconductor substrate having a first element area and a second element area on a surface thereof; a first transistor of a double gate type having a floating gate and a control gate whose side walls are covered with a thermally oxidized film, and having gate bird's beaks having a first length, formed in the first element area; and a second transistor having a gate electrode having gate bird's beaks having a second length shorter than the first length, formed in the second element area, wherein the first transistor operates as a non-volatile memory cell capable of electrically writing and erasing data and the second transistor operates as a logical circuit element.

According to another aspect of the present invention, there is provided a manufacture method for a semiconductor device, comprising steps of: (a) forming an element separation region in a semiconductor substrate to define first and second areas; (b) forming a floating gate structure lamination layer on the first area; (c) forming a lamination of a gate electrode conductive layer and a masking insulating layer above the floating gate structure lamination layer and above the second area; (d) pattering the masking insulating film in a gate electrode shape; (e) masking the second area, and by using the masking insulating layer as an etching mask, etching the gate electrode conductive layer and the floating gate structure lamination layer in the first area to pattern a floating gate structure and a control gate structure; (f) forming an oxide film on side walls of at least the floating gate structure; and (g) masking the first area, and by using the masking insulating layer as an etching mask, etching the gate electrode conductive layer in the second area to pattern an insulated gate structure.

DESCRIPTION OF THE PREFERRED EMBODIMENTS

Embodiments of the present invention will be described with reference to the accompanying drawings.

An electrically erasable non-volatile semiconductor memory uses high voltage for programming and erasure. If a programming circuit and an erase circuit are integrated with a non-volatile memory circuit, high voltage field effect (abbreviated to MOS) transistors are required to be integrated. A logical circuit is made of low voltage MOS transistors for reducing the power dissipation. If a non-volatile memory circuit and a logical circuit are integrated, low voltage MOS transistors are required to be integrated.

First Embodiment

Figure 1A:
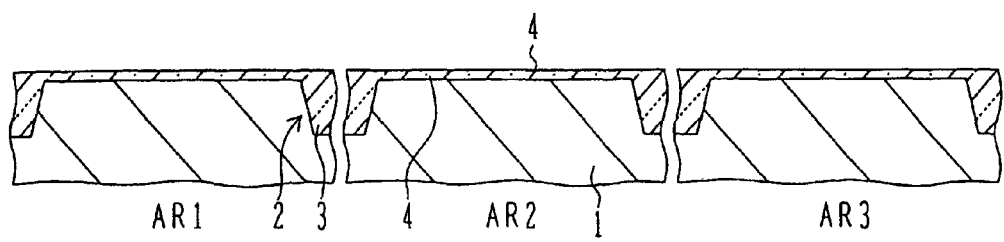
FIGS. 1A to 1N are cross sectional views illustrating main processes of a semiconductor device manufacture method according to a first embodiment of the present invention.
Figure 1B:
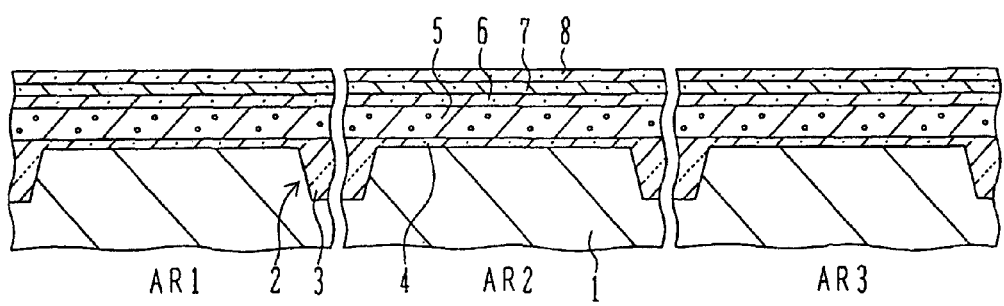
Figure 1C:
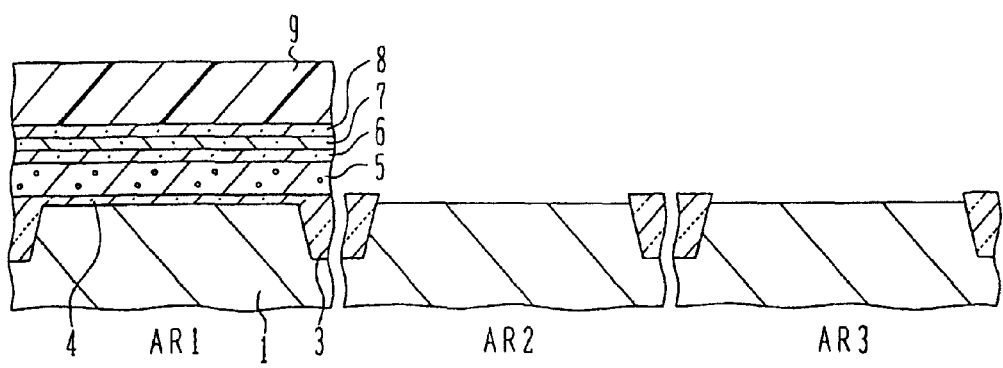
Figure 1D:
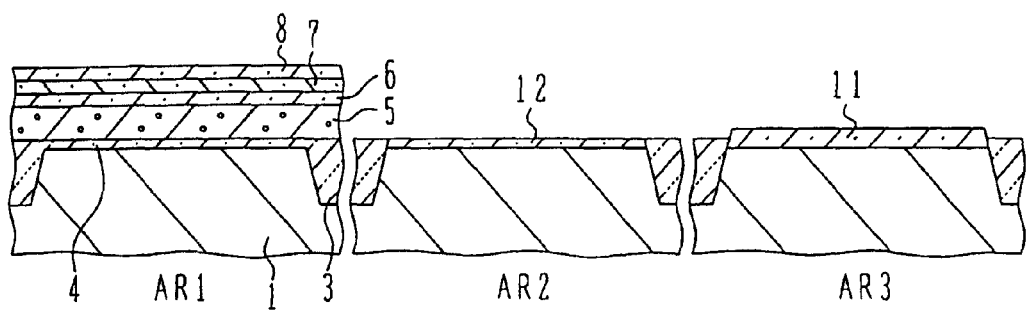
Figure 1E:
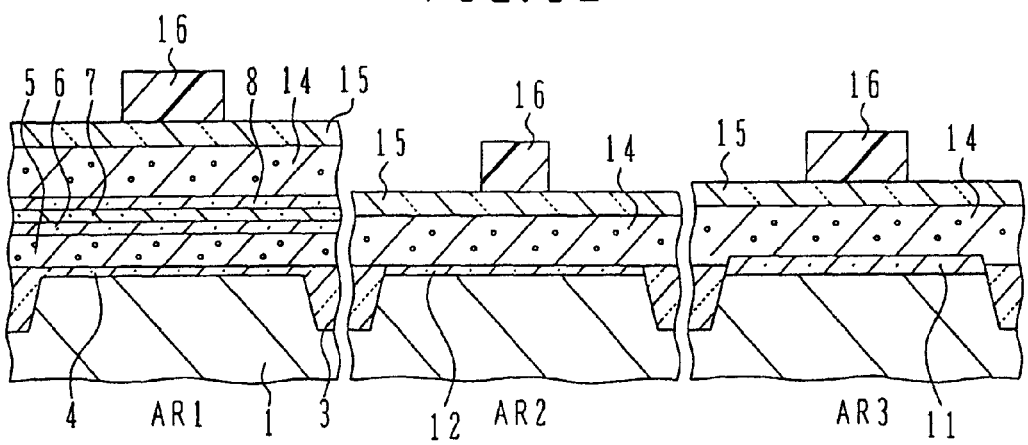
Figure 1F:
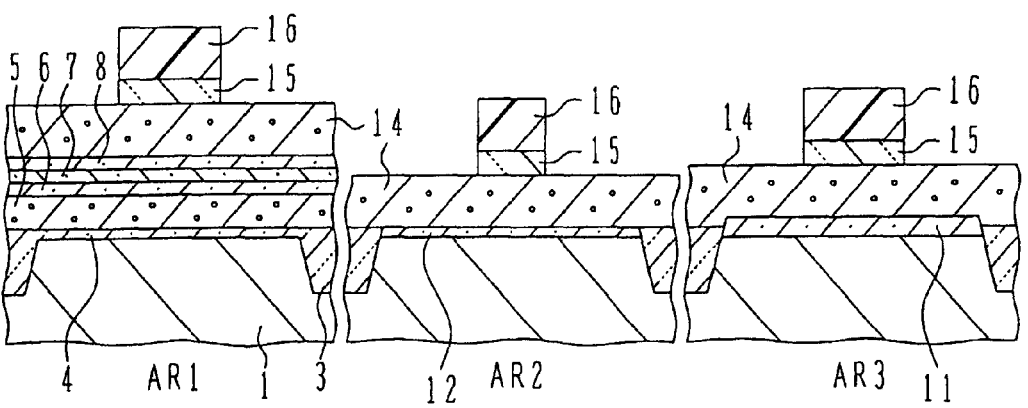
Figure 1G:
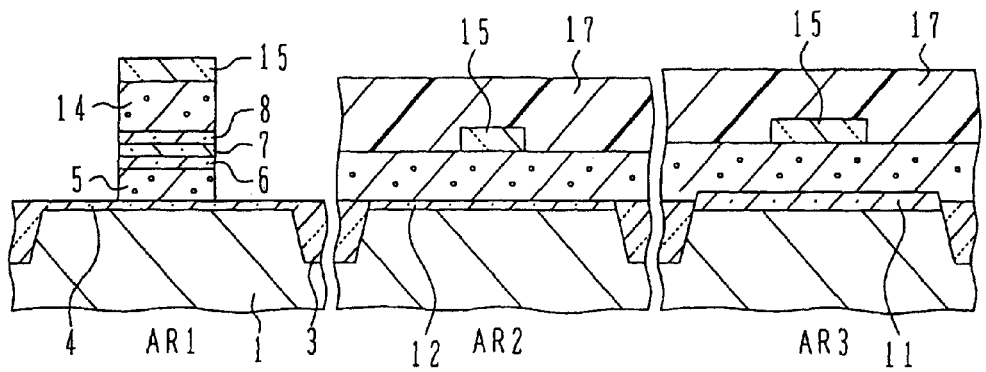
Figure 1H:
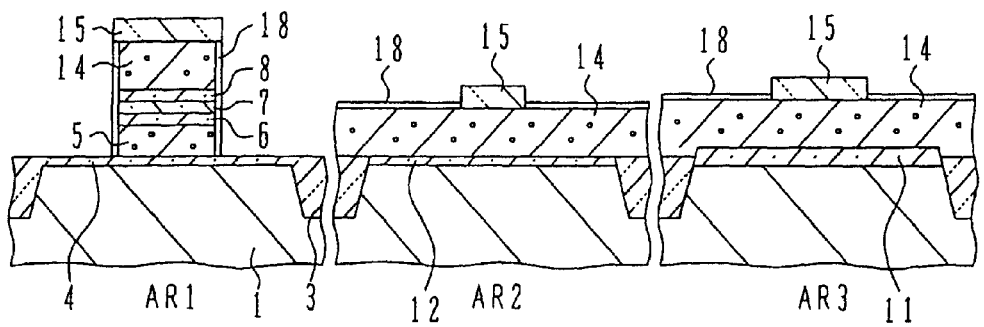
Figure 1I:
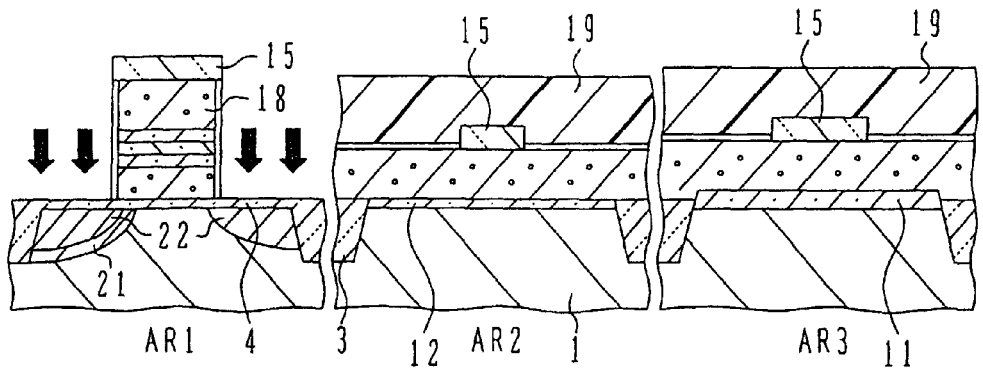
Figure 1J:
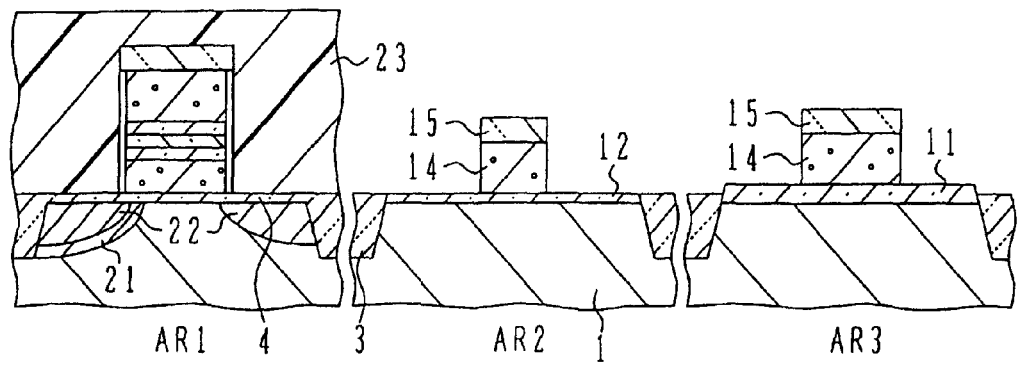
Figure 1K:
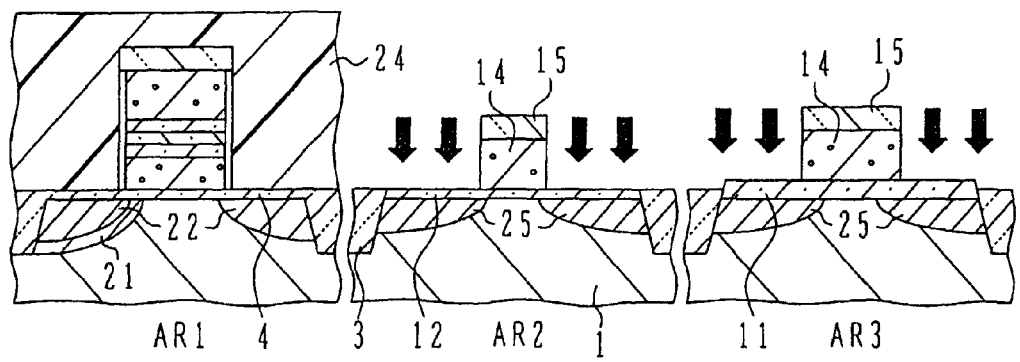
Figure 1L:
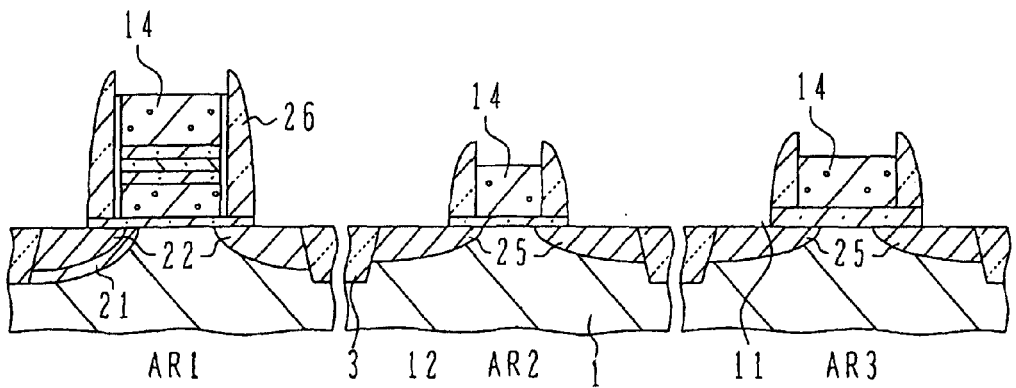
Figure 1M:
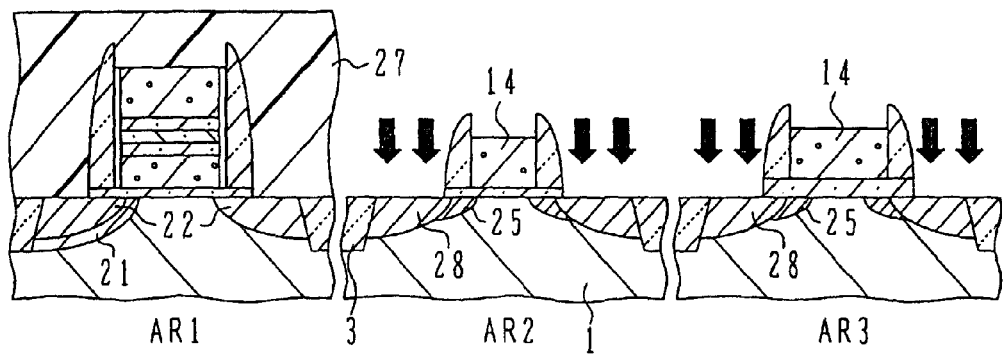
Figure 1N:
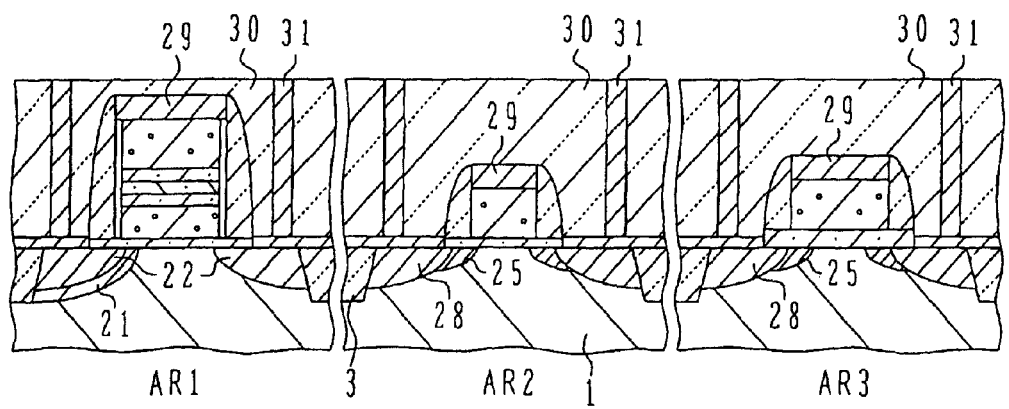

FIGS. 1A to 1N are cross sectional views illustrating a semiconductor device manufacture method according to the first embodiment of the present invention.

As shown in FIG. 1A, a shallow trench 2 is formed in a principal surface of a semiconductor substrate 1 such as a silicon substrate, an insulating film is buried in the trench and the insulating film on the substrate surface is removed to form a shallow trench isolation (STI) 3. The isolation region may also be formed by local oxidation of silicon (LOCOS). Areas AR1, AR2 and AR3 surrounded by STI are defined. In the area AR1, a non-volatile memory cell is formed, in the area AR2, a low voltage MOS transistor of a logical circuit is formed, and in the area AR3, a high voltage MOS transistor is formed which controls non-volatile memory cells.

A thermally oxidized film 4 is formed to a thickness of 6 nm to 12 nm in an oxidizing atmosphere by heating the semiconductor substrate to 800° C. to 1100° C. This thermally oxidized film 4 constitutes a tunneling oxide film of a non-volatile memory cell.

As shown in FIG. 1B, an amorphous silicon film 5 is deposited on the tunneling oxide film 4 to a thickness of 50 nm to 100 nm by chemical vapor deposition (CVD). The amorphous silicon film 5 is doped with n-type impurities, phosphorus, at $1\times10^{20}$ cm$^{-3}$ to $3\times10^{21}$ cm$^{-3}$ and functions as a floating gate electrode of the non-volatile memory cell. Phosphorus ions may be implanted after a non-doped amorphous silicon film is formed.

On the amorphous silicon film 5, a silicon oxide film 6 having a thickness of 4 nm to 8 nm is formed by CVD at a temperature of 700° C. to 800° C. and a silicon nitride film 7 having a thickness of 5 nm to 10 nm is formed by CVD at a temperature of 650° C. to 800° C. A thermally oxidized film 8 having a thickness of 3 nm to 10 nm is formed on the surface of the silicon nitride film 7 in an oxidizing atmosphere at 900° C. to 1000° C. The above-described and subsequent heating processes change the amorphous silicon film to a polysilicon film. In this manner, a lamination of an oxide film—a nitride film—an oxide film (ONO film) is formed on the silicon film 5.

As shown in FIG. 1C, the surface of the area AR1 is covered with a resist mask 9, and the ONO film, silicon film 5 and tunneling oxide film 4 in the areas AR2 and AR3 are etched and removed. The silicon surface is exposed in the areas AR2 and AR3. The resist mask 9 is thereafter removed.

As shown in FIG. 1D, on the exposed silicon surface, a thermally oxidized film 11 having a thickness of 10 nm to 50 nm is formed at 800° C. to 1100° C. This thermally oxidized film 11 which may be thickened by the following thermal oxidation constitutes a gate oxide film of a high voltage MOS transistor. The thermally oxidized film in the area AR2 is etched and removed. Next, thermal oxidation at a temperature of 700° C. to 1100° C. is performed to form a thermally oxidized film 12 having a thickness of 1.5 nm to 8 nm on the surface of the area AR2. This thermally oxidized film 12 constitutes a gate oxide film of a low voltage MOS transistor.

In this manner, a thin gate oxide film 12 suitable for the low voltage MOS transistor is formed in the area AR2 and a thick oxide film 11 suitable for the high voltage MOS transistor is formed in the area AR3.

As shown in FIG. 1E, an amorphous silicon film 14 is formed on the surface of the silicon substrate by CVD. The amorphous silicon film is doped with n-type impurities, phosphorus, at $5\times10^{20}$ cm$^{-3}$ to $5\times10^{21}$ cm$^{-3}$ and has a thickness of 150 nm to 250 nm. Phosphorus ions may be implanted after a non-doped amorphous silicon film is formed.

If low resistance is desired, a tungsten silicide (WSi) film may be grown on the amorphous silicon film by CVD to a thickness of 100 nm to 200 nm.

A plasma-enhanced CVD nitride film 15 as a hard mask layer is grown to a thickness of 20 nm to 150 nm. In place of the plasma-enhanced CVD nitride film, a hard mask layer of a plasma-enhanced CVD oxynitride film, a plasma-enhanced CVD oxide film or the like may be used. Formed in this manner is a lamination of a conductive layer as a gate electrode and an upper hard mask layer. On the hard mask layer 15, a resist pattern 16 having each gate electrode shape is formed.

As shown in FIG. 1F, by using the resist pattern 16 as an etching mask, the underlying hard mask layer 15 is etched to pattern the hard mask layer 15 in the gate electrode shape. The resist pattern 16 is thereafter removed.

As shown in FIG. 1G, the areas AR2 and AR3 are covered with a resist mask 17, and by using the hard mask 15 as an etching mask, the silicon layer 14, ONO film 6, 7, 8 and silicon layer 5 in the area AR1 are etched to pattern the gate electrode of the non-volatile memory cell. The resist mask 17 is thereafter removed.

As shown in FIG. 1H, the substrate is heated to 800° C. to 900° C. in an oxidizing atmosphere to form a thermally oxidized film 18 having a thickness of 3 nm to 10 nm on the side walls of exposed silicon layers. While the side walls of the silicon layers 5 and 14 are thermally oxidized, oxidizing species enter the interfaces between the silicon substrate 1, silicon layers 5 and 14 and insulating layers so that bird's beaks are formed at the edge portions of the insulating film.

In the areas AR2 and AR3, an oxide film 18 is formed on the surface of the silicon layer 14. Since the surface of the silicon substrate 1 is covered with the gate oxide films 11 and 12 and silicon film 14, it is not oxidized.

Figure 2:
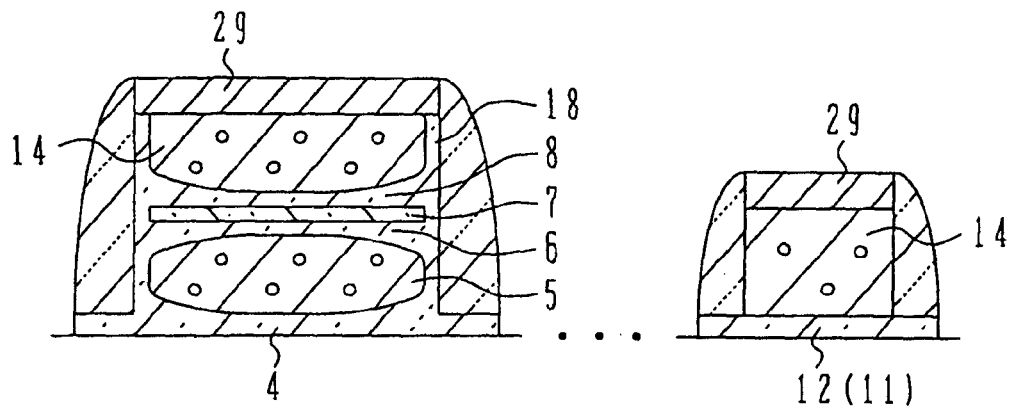
FIG. 2 is an enlarged cross sectional view showing the structure of a gate electrode formed by the first embodiment method.

FIG. 2 is an enlarged view of the gate electrode structures of the non-volatile memory cell and MOS transistor. Although the bird's beaks are formed at the edge portions of the oxide films 4, 6 and 8, no bird's beak is formed at the oxide film 12 (11).

As shown in FIG. 1I, the surfaces of the areas AR2 and AR3 are covered with a resist mask 19, and a low impurity concentration n-type region 21 is formed in the area AR1 by phosphorus ion implantation at an acceleration energy of 30 keV to 70 keV and a dose of $1\times10^{14}$ cm$^{-3}$ to $1\times10^{15}$ cm$^{-2}$. In FIG. 1I, although the low impurity concentration n-type region 21 is formed only on one side of the gate electrode, it may be formed on both sides.

A high impurity concentration n-type region 22 is formed by implanting arsenic ions at an acceleration energy of 30 keV to 60 keV and a dose of $2\times10^{15}$ cm$^{-2}$ to $7\times10^{15}$ cm$^{-2}$. In this manner, the high impurity concentration source/drain regions 22 are formed on both sides of the gate electrode and the low impurity concentration n-type region 21 is formed surrounding at least one of the source/drain regions 22. The low impurity concentration n-type region 21 exhibits the function of raising an efficiency of draining charges from the silicon layer 5.

As shown in FIG. 1J, the area AR1 is covered with a resist mask 23, and by using the hard mask 15 as an etching mask, the silicon layer 14 in the areas AR2 and AR3 is etched to pattern the gate electrodes in the areas AR2 and AR3. The resist mask 23 is thereafter removed.

As shown in FIG. 1K, after the gate electrodes in the areas AR2 and AR3 are patterned, ion implantation is performed to form low impurity concentration extensions 25 of source/drain regions. In forming a CMOS circuit, p- and n-channel MOS transistor regions are selectively exposed by using masks to separately implanting p- and n-type impurity ions.

As shown in FIG. 1L, an insulating film such as a silicon oxide film is deposited on the surface of the silicon substrate by CVD, and anisotropic etching such as reactive ion etching (RIE) is performed to remove the insulating film on the flat surface and form side wall spacers 26 on the side walls of the gate structures. If the hard mask layer 15 is left on the gate electrode, it is etched and removed.

As shown in FIG. 1M, the area AR1 is covered with a resist mask 27, and n-type impurity ions are implanted at a high impurity concentration into the areas AR2 and AR3 to form high impurity concentration source/drain regions 28. In forming a CMOS circuit, similar to the above-description, p- and n-channel regions are selectively exposed by using masks to separately implanting p- and n-type impurity ions. The resist mask 27 is thereafter removed. Implanted impurity ions are activated by an annealing process. These heating processes change the silicon layer 14 to a polysilicon layer.

As shown in FIG. 1N, a Co film is deposited on the substrate surface and a CoSi film 29 is formed on each of the silicon surfaces through silicidation. Unreacted Co is removed. Thereafter, an interlayer insulating film 30 is formed on the substrate surface and its surface is planarized by chemical mechanical polishing (CMP). Thereafter, contact holes are formed by using a resist mask. A barrier metal layer and a W layer are deposited, being filled in the contact holes. The metal layers on the flat surface are removed by CMP to form W plugs 31.

In the manner described above, non-volatile memory cells are formed in the area AR1, low voltage MOS transistors are formed in the area AR2, and high voltage MOS transistors are formed in the area AR3. High drive performance of MOS transistors is retained because bird's beaks are prevented from being formed. A position alignment margin is small since the gate electrode of each semiconductor device is formed by a single mask process.

FIG. 2 is an enlarged view of the gate electrode of the non-volatile memory cell and the gate electrode of the MOS transistor formed by the above-described processes. The thermally oxidized film 18 is formed on the side walls of the silicon layer 5 as the floating gate electrode of a non-volatile memory cell, so that leak of charges in the silicon layer 5 can be reduced. While the thermally oxidized film 18 is formed, oxidizing species enter the interfaces between the silicon substrate 1, silicon layers 5 and 14 and insulating layers 4, 6 and 8, and bird's beaks are formed.

In the gate electrode of a MOS transistor, the silicon gate electrode 14 is formed on the gate oxide film 12 (11) of uniform thickness. Since no bird's beak is formed at the gate oxide film 12 (11), a voltage applied to the gate electrode is efficiently applied to the channel so that the drive performance of the MOS transistor can be retained. There may be some possibility of allowing generation of weak bird's beaks under the gate electrode of logical MOS transistor, such bird's beaks are shorter than the bird's beaks of the non-volatile memory cell, and will not appreciably affect the performance of the logical MOS transistor.

Figure 3A:
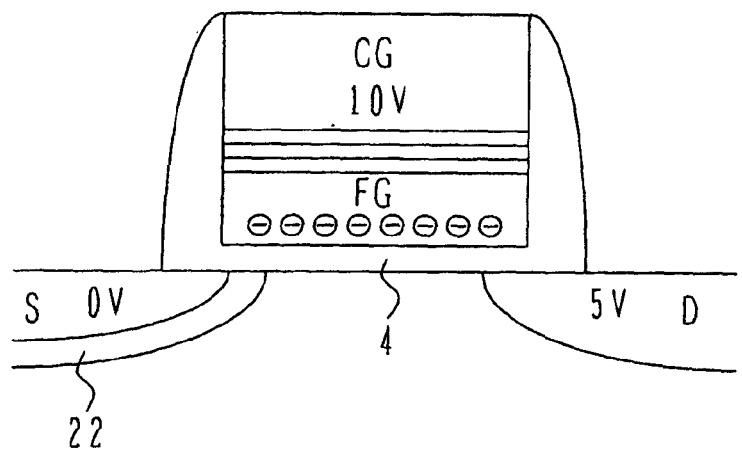
FIGS. 3A and 3B are diagrams illustrating an operation of a non-volatile memory cell.

FIG. 3A illustrates a write operation of writing information in a non-volatile memory cell. A source region S is grounded, 5 V is applied to a drain region D, and a high voltage of 10 V is applied to a control gate CG. Electrons transferred from the source region S toward the drain region D become hot electrons due to a high electric field, and these electrons are injected from the channel into the a floating gate region FG. Programming (write operation) is performed in this manner.

Figure 3B:
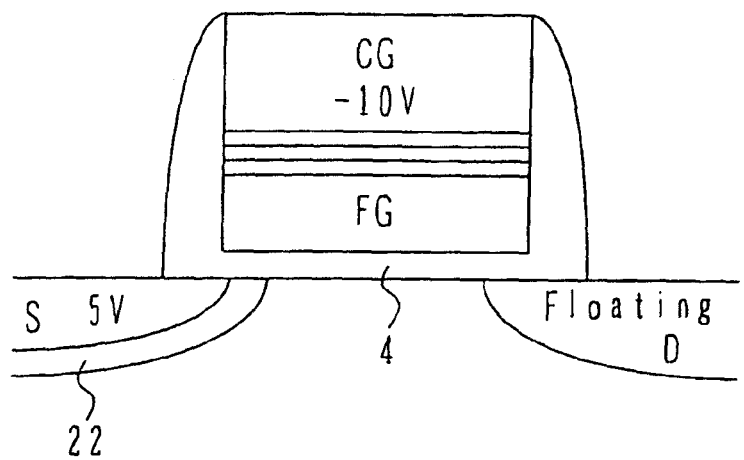

FIG. 3B illustrates an erase operation of erasing information in the memory cell. A voltage of −10 V is applied to the control gate CG, and a voltage of 5 V is applied to the source region S having the low impurity concentration region 22. As a high electric field is applied to the tunneling oxide film 4, electrons in the floating gate FG FN-tunnel through the tunneling oxide film 4 and are drained into the low concentration region 22 of the source region. In this case, the other drain region D is preferably in an electrically floating state.

In the embodiment described above, the thermally oxidized film is formed on the side walls of the floating gate electrode of a non-volatile memory cell and bird's beaks are allowed to be formed. No bird's beak is formed in the low voltage MOS transistor and high voltage MOS transistor.

The operation of a high voltage MOS transistor is not hindered by bird's beaks at the edge portions of a gate electrode, and bird's beaks provide a function of raising a breakdown voltage.

Second Embodiment

FIGS. 4A to 4D illustrate a semiconductor device manufacture method according to the second embodiment of the present invention. Description will be made mainly on those points different from the first embodiment.

Figure 4A:
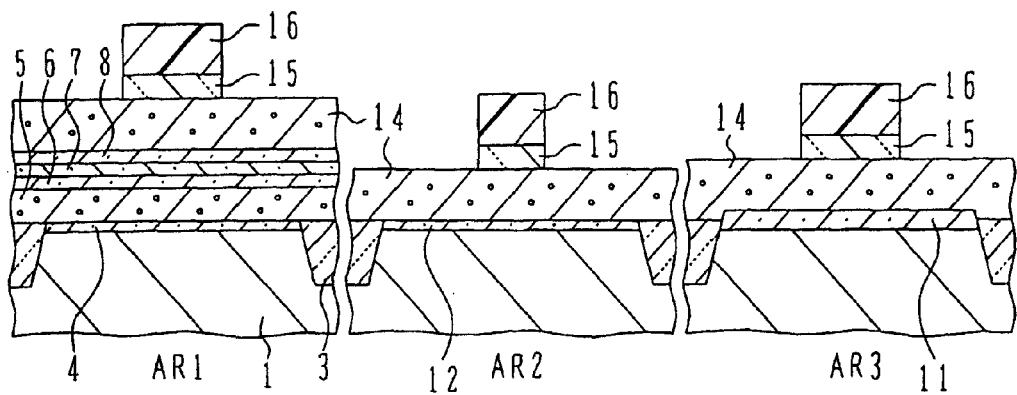
FIGS. 4A to 4D are cross sectional views illustrating main processes of a semiconductor device manufacture method according to a second embodiment of the present invention.

FIG. 4A shows the state similar to FIG. 1F. In the area AR1, formed on the tunneling oxide film 4 are the silicon layer 5, ONO film 6, 7, 8 and silicon layer 14 as the control gate. The hard mask layer 15 on the silicon layer is patterned by using the resist pattern 16. In the areas AR2 and AR3, formed on the gate oxide film 12, 11 is the silicon layer 14 on which the hard mask layer 15 is patterned by using the resist pattern 16.

Figure 4B:
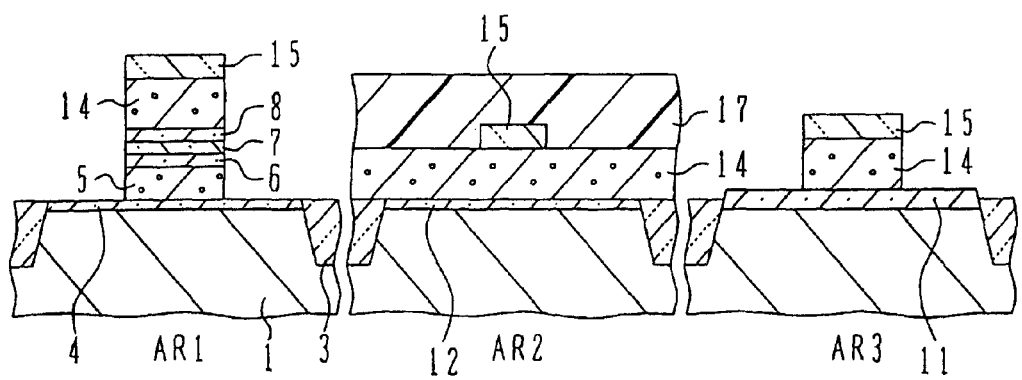

As shown in FIG. 4B, the area AR2 is covered with a resist mask 17, and by using the hard mask 15 as an etching mask, the underlying silicon layer 14, ONO film 6, 7, 8 and silicon layer 5 in the areas AR1 and AR3 are etched. The gate electrode structure of a non-volatile memory cell and the gate electrode of a high voltage MOS transistor are therefore patterned. The resist mask 17 is thereafter removed.

Figure 4C:
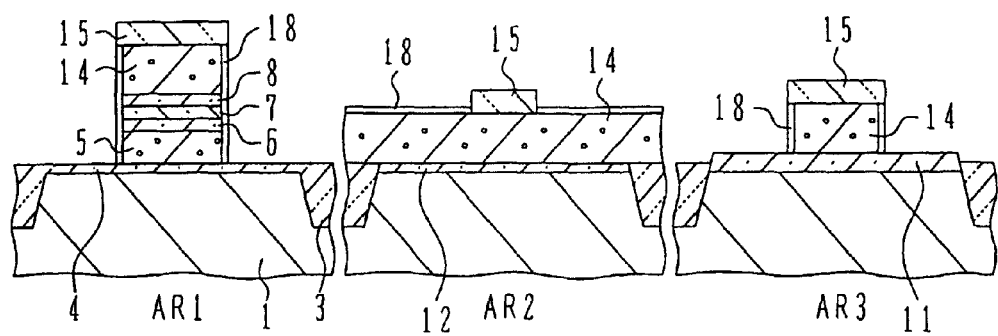

As shown in FIG. 4C, a thermally oxidized film 18 is formed on the side walls of the gate electrode structure in an oxidizing atmosphere. The thermally oxidized film is therefore formed on the side walls of the gate electrodes of a non-volatile memory cell and a high voltage MOS transistor, and bird's beaks appear. In the area AR2 where low voltage MOS transistors are formed, the thermally oxidized film 18 is formed on the surface of the silicon layer 14. Since the surface of the silicon substrate 1 is covered with the gate oxide film 12 and silicon layer 14, it is possible to prevent bird's beaks from being formed under the gate electrode.

Thereafter, processes similar to those described with FIGS. 1I to 1N are executed to form the non-volatile memory cell structure and the MOS transistor structures.

Figure 4D:
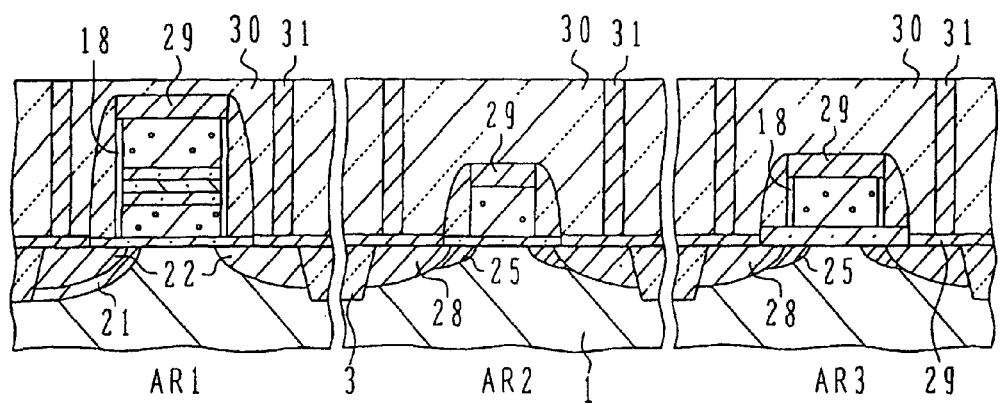

FIG. 4D shows the finished structure. Formed on a silicon surface is a silicide layer 29, and the substrate is covered with an interlayer insulating film 30. W plugs 31 are formed through the interlayer insulating film. In this semiconductor device, the non-volatile memory cell and low voltage MOS transistor have the structure similar to that of the first embodiment. The side walls of the gate electrode of a high voltage MOS transistor is covered with the thermally oxidized film 18. Bird's beaks are formed under the edge portions of the gate electrode of a high voltage MOS transistor while the thermally oxidized film is formed, so that a breakdown voltage of the high voltage MOS transistor is raised.

In the first and second embodiments, the floating gate structure is made of a silicon layer. The floating gate structure with the charge retention function may also be made of an ONO film.

Third Embodiment

FIGS. 5A to 5E illustrate a semiconductor device manufacture method according to the third embodiment of the present invention.

Figure 5A:
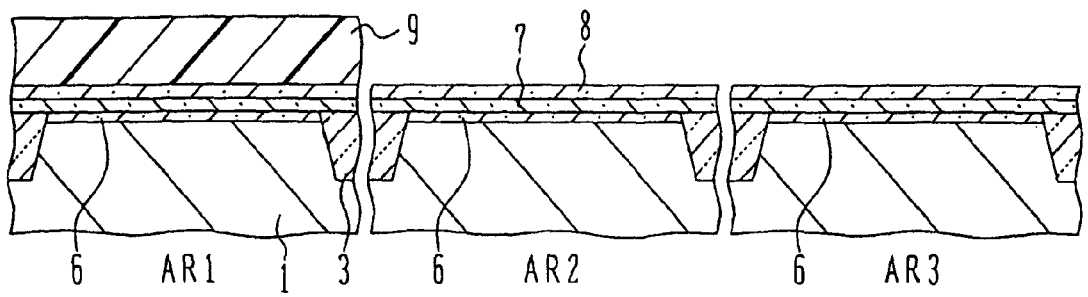
FIGS. 5A to 5E are cross sectional views illustrating main processes of a semiconductor device manufacture method according to a third embodiment of the present invention.

As shown in FIG. 5A, on the surface of a silicon substrate 1 with STI 3, a thermally oxidized film 6 having a thickness of 3 nm to 8 nm is formed through thermal oxidation at 800° C. to 1100° C. On the thermally oxidized film, a nitride film 7 having a thickness of 5 nm to 15 nm is formed by CVD at 650° C. to 800° C., and on the nitride film, a thermally oxidized film 8 having a thickness of 3 nm to 10 nm is formed through thermal oxidation at 900° C. to 1000° C. An oxide film may be formed on the nitride film 7 by CVD. An ONO film is therefore formed. Similar to the above-described embodiments, LOCOS may be used in place of STI.

The area AR1 is covered with a resist pattern 9. By using the resist pattern 9 as an etching mask, the ONO film 6, 7, 8 in the areas AR2 and AR3 is etched. The resist mask 9 is thereafter removed.

Figure 5B:
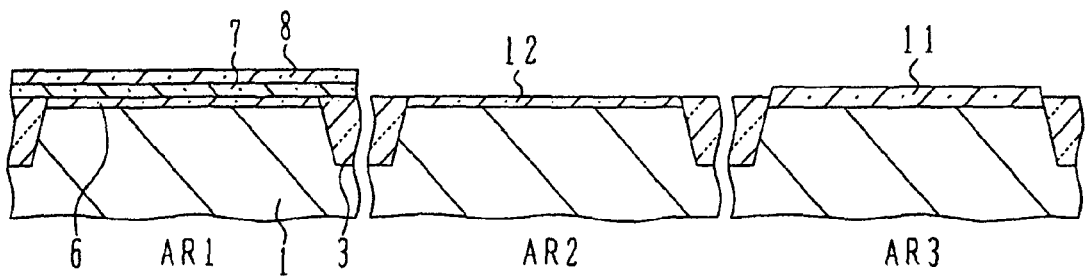

As shown in FIG. 5B, a thermally oxidized film 11 having a thickness of 5 nm to 50 nm is formed in the area AR3 through thermal oxidation at 800° C. to 1100° C. The thermally oxidized film in the area AR2 is removed and a thermally oxidized film 12 having a thickness of 1.5 nm to 8 nm is newly formed in the area AR2 through thermal oxidation at 700° C. to 1100° C.

Figure 5C:
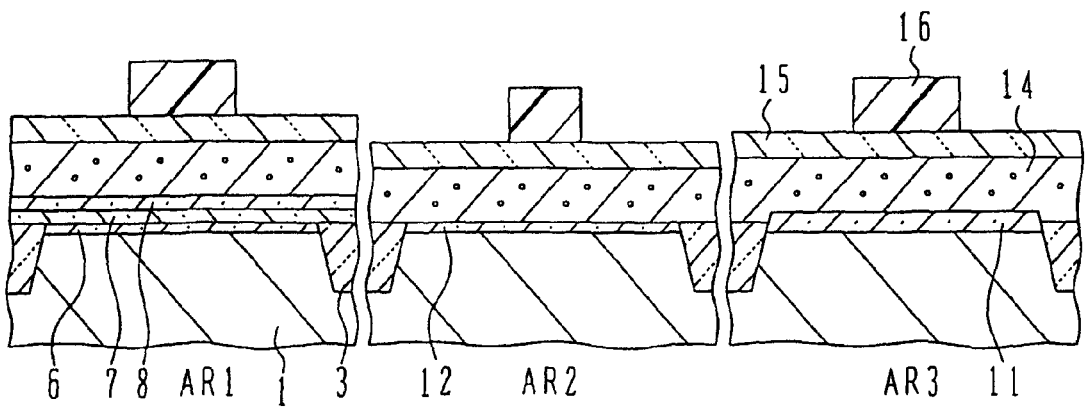

As shown in FIG. 5C, an amorphous silicon layer 14 is grown by CVD on the ONO film 6, 7, 8 and gate oxide films 11 and 12 to a thickness of 150 nm to 250 nm, the amorphous silicon layer functioning as a control gate electrode and gate electrodes. On the amorphous silicon layer 14, a plasma-enhanced CVD nitride film functioning as a hard mask is grown to a thickness of 20 nm to 150 nm by plasma-enhanced CVD.

A resist pattern 16 having each gate electrode shape is formed on the hard mask layer 15. By using the resist pattern 16 as an etching mask, the hard mask layer 15 is patterned in the gate electrode shape. Thereafter, a process similar to the process shown in FIG. 1G is executed to pattern the gate electrode structure of a non-volatile memory cell. The silicon layer 14 in the areas AR2 and AR3 is not patterned but left as it is.

Figure 5D:
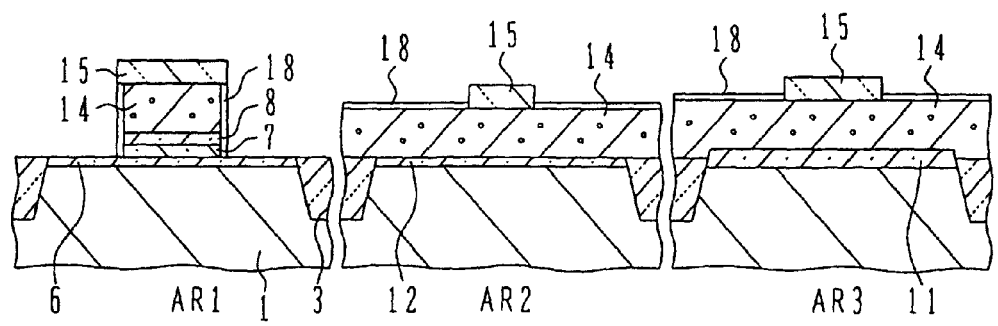

As shown in FIG. 5D, a thermally oxidized film 18 is formed on the side walls of the gate electrode structure of the non-volatile memory cell. In the areas AR2 and AR3, the oxide layer 18 is formed on the surface of the silicon layer 14. Bird's beaks are not formed under the gate electrodes. Processes similar to those shown in FIGS. 1I to 1N of the first embodiment are executed to form the non-volatile memory cell structure and the MOS transistor structures.

Figure 5E:
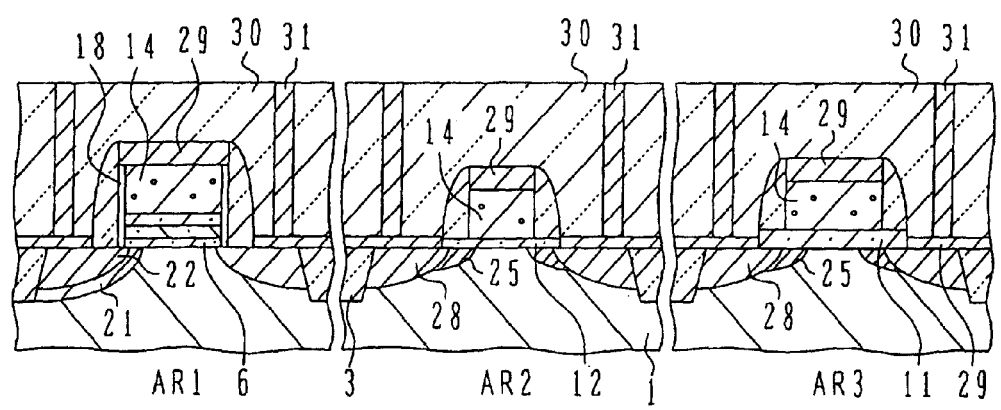

FIG. 5E shows the finished structure. The non-volatile memory cell has the gate electrode structure above the channel region, constituted of the ONO film 6, 7, 8 and floating gate electrode 14 made of a silicon layer, the side walls of the gate electrode structure being covered with the oxide film 18. In the areas AR2 and AR3, the gate electrode 14 made of a silicon layer is formed on the gate oxide films 11 and 12, and the thin oxide film 18 is not formed on the side walls.

In the third embodiment, no bird's beak is formed under the gate electrode of the high voltage MOS transistor. Similar to the second embodiment, bird's beaks may be formed under the gate electrode of the high voltage MOS transistor.

Fourth Embodiment

FIGS. 6A to 6E illustrate a semiconductor device manufacture method according to the fourth embodiment of the present invention. Description will be made mainly on those points different from the first embodiment.

Figure 6A:
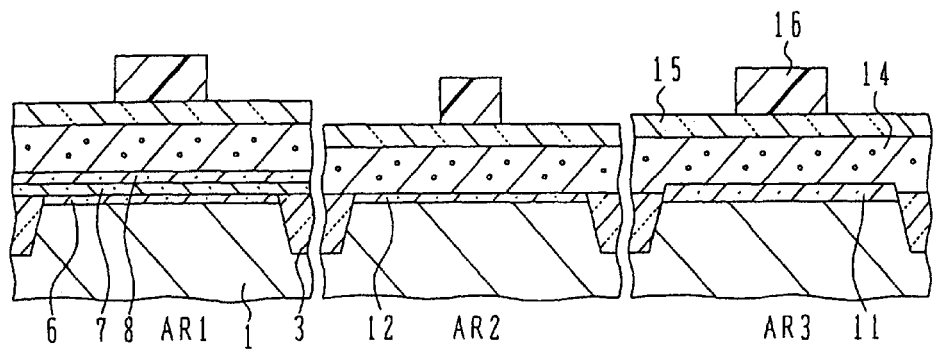
FIGS. 6A to 6E are cross sectional views illustrating main processes of a semiconductor device manufacture method according to a fourth embodiment of the present invention.

FIG. 6A shows the state similar to FIG. 5C. Formed on the hard mask layer 15 is a resist pattern 16 having each gate electrode shape. By using the resist pattern 16 as an etching mask, the hard mask 15 is etched.

Figure 6B:
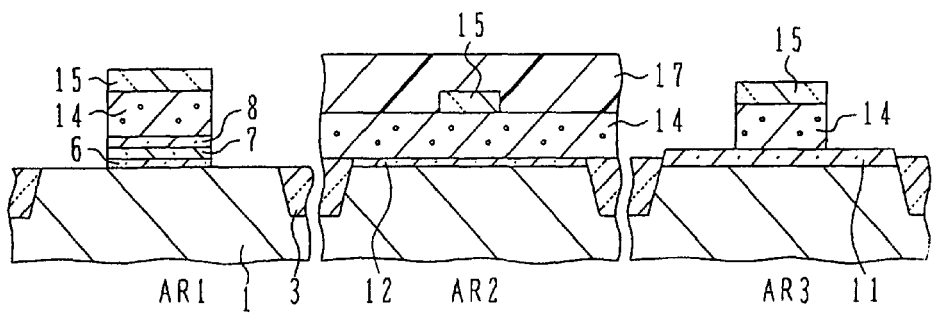

As shown in FIG. 6B, the area AR2 is covered with a resist mask 17, and by using the hard mask layer 15 as an etching mask, the underlying gate electrode layer 14 in the areas AR1 and AR3 is patterned. The resist mask 17 is thereafter removed.

Figure 6C:
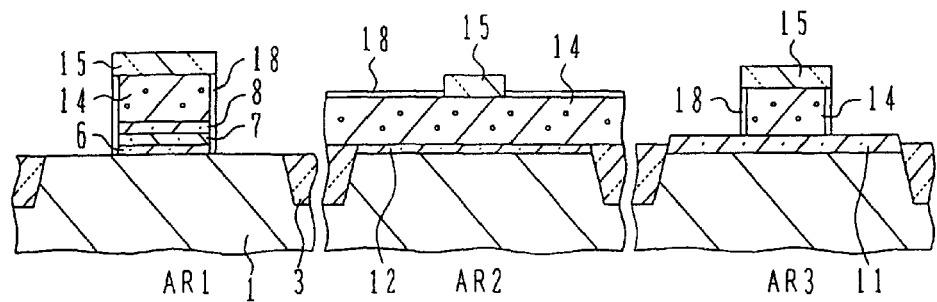

As shown in FIG. 6C, in the areas AR1 and AR3, a protective oxide film 18 such as a thermally oxidized film is formed on the side walls of gate electrode structures. In the area AR2, the oxide film 18 is formed on the silicon layer 14. No bird's beak is formed under the gate electrode.

Thereafter, similar to the process shown in FIG. 1I, a resist mask exposing only the area AR1 is formed, and impurity ions are implanted in source/drain regions of the non-volatile memory cell.

Figure 6D:
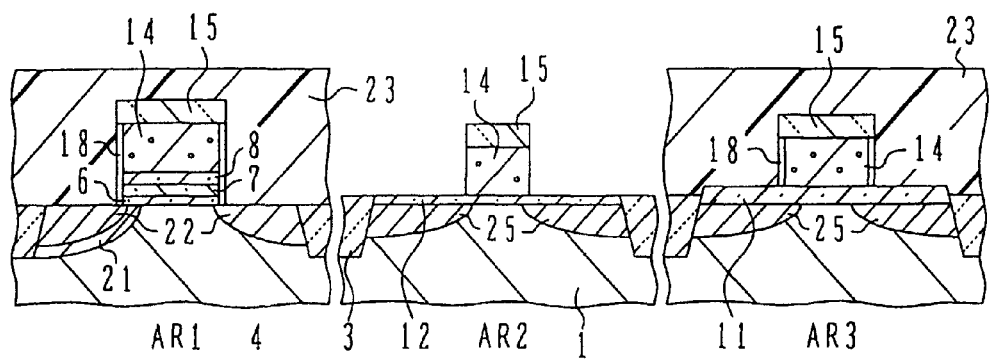

As shown in FIG. 6D, the areas AR1 and AR3 are covered with a resist mask 23, and by using the hard mask 15 as an etching mask, the silicon layer 14 in the area AR2 is etched to pattern the gate electrode 14.

Thereafter, processes similar to those shown in FIG. 1K to 1N are executed to form the non-volatile memory cell structure and the MOS transistor structures.

Figure 6E:
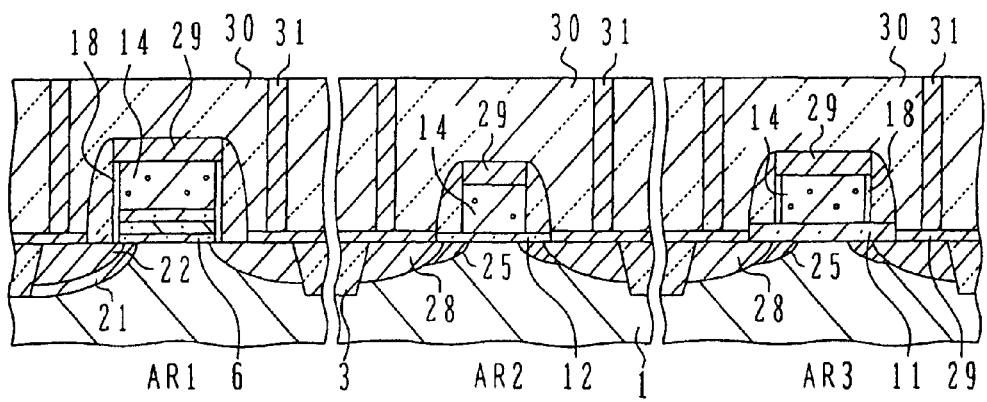

FIG. 6E shows the finished structure. The protective oxide film 18 is formed on the side walls of the gate electrode structure of the non-volatile memory cell and on the side walls of the high voltage MOS transistor. While the protective oxide film is formed, bird's beaks are formed under the gate electrode. The bird's beaks of the high voltage MOS transistor improve the breakdown voltage of the gate electrode structure.

Figure 7A:
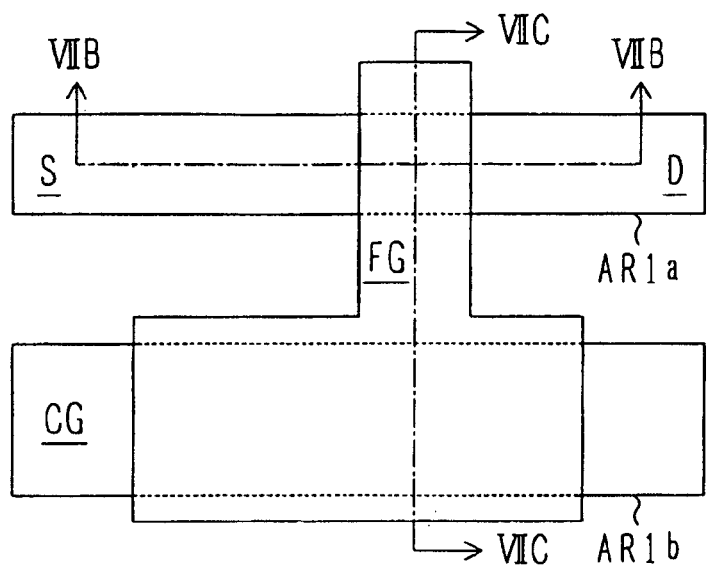
FIGS. 7A to 7G are a plan view and cross sectional views illustratively showing the structure and operation of a non-volatile semiconductor memory cell having a single layer gate electrode.
Figure 7B:
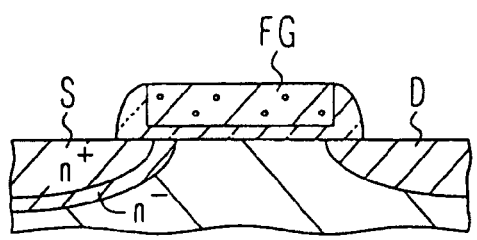
Figure 7C:
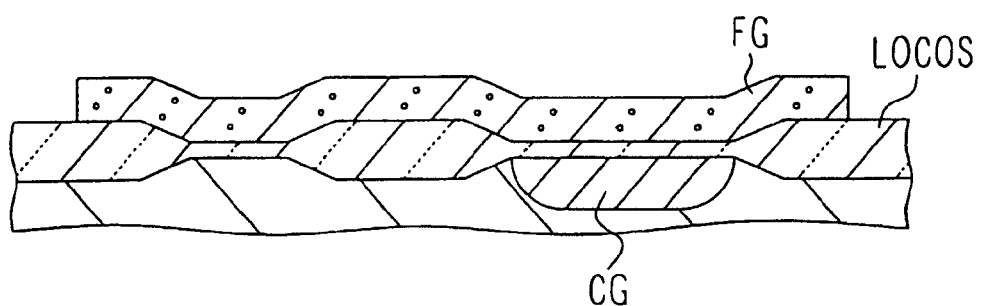

FIGS. 7A to 7C show the structure of a non-volatile memory cell having a single layer gate electrode wherein a control gate electrode is formed in a substrate. FIG. 7A is a plan view and FIGS. 7B and 7C are cross sectional views taken along one-dot chain lines VIIB-VIIB and VIIC-VIIC in FIG. 7A, respectively.

Referring to FIG. 7A, a non-volatile memory cell is formed by using two areas. In an area AR1a in an upper portion of FIG. 7A, a source region S and a drain region D are formed on both sides of a floating gate electrode FG. An area AR1b in a lower portion of FIG. 7A is a control gate region CG made of a low resistance region doped with impurities at a high impurity concentration. The floating gate electrode FG traverses the area AR1a and extends above the area AR1b in a broad area of the control gate region.

FIG. 7B shows the transistor structure formed in the area AR1a. The source region S has a low impurity concentration region surrounding a high impurity concentration region to improve the erase operation.

FIG. 7C shows the structure of the floating gate electrode FG extending from the transistor structure to the control gate region. The control gate CG is made of a high impurity concentration region in an active region defined by an isolation region LOCOS made of a locally oxidized film. The floating gate FG and control gate CG confront each other via an insulating film. As voltage is applied to the control gate, voltage can be applied to the channel region in the transistor area via the floating gate FG.

Figure 7D:
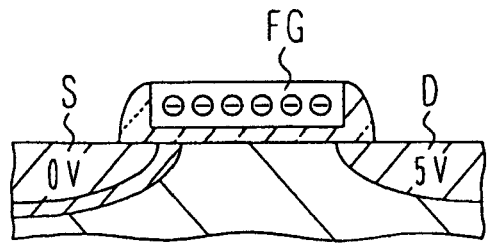
Figure 7E:
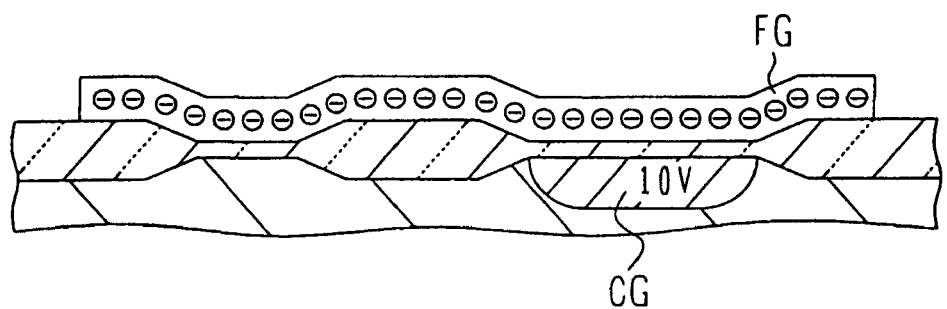

FIGS. 7D and 7E are cross sectional views illustrating a programming operation. 0 V is applied to the source region S, and 5 V is applied to the drain region D. A voltage of 10 V is applied to the control gate region CG. Electrons transferred from the source region S toward the drain region D in the transistor structure become hot electrons due to a high electric field and injected into the floating gate FG. Since the floating gate FG extends from the transistor area to an area above the control gate, the whole floating gate FG is charged as shown in FIG. 7E.

Figure 7F:
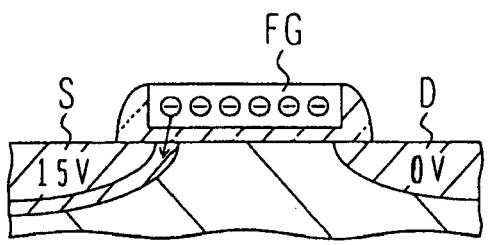
Figure 7G:
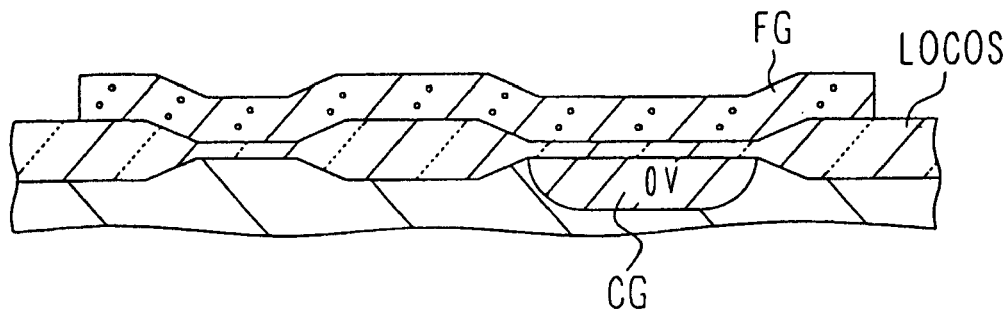

FIGS. 7F and 7G illustrate an erase operation. A high voltage of 15 V is applied to the source region S, and 0 V is applied to the control gate CG. The drain region D is also set to 0 V. Voltage at the control gate CG controls the potential of the floating gate. Electrons in the floating gate FG are drained by the high electric field and move through tunneling from the floating gate FG to the low impurity concentration region of the source region S. Charges in the floating gate FG are thereby drained.

Fifth Embodiment

FIGS. 8A to 8E illustrate a semiconductor device manufacture method according to the fifth embodiment of the present invention, wherein the single layer gate electrode is used for a non-volatile memory cell.

Figure 8A:
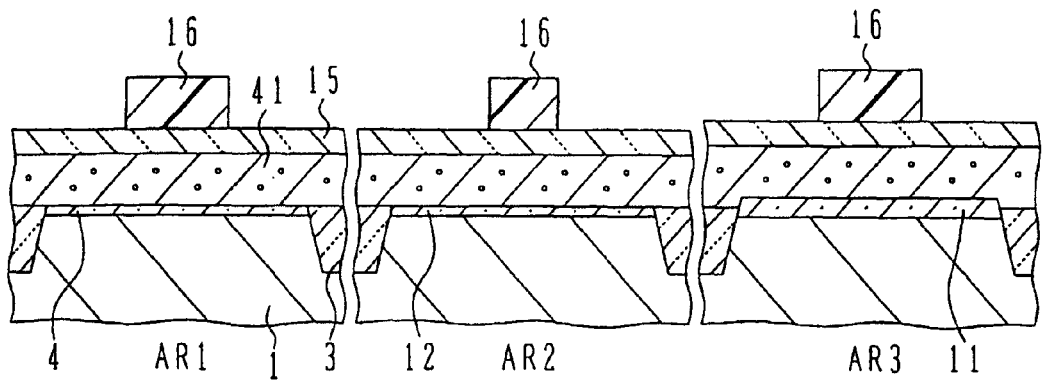
FIGS. 8A to 8E are cross sectional views illustrating main processes of a semiconductor device manufacture method according to a fifth embodiment of the present invention.

As shown in FIG. 8A, on the surface of a silicon substrate 1 with STI 3, a tunneling oxide film 4 for a non-volatile memory cell, a gate oxide film 12 for a low voltage MOS transistor and a gate oxide film 11 for a high voltage MOS transistor are formed, and a silicon layer 41 is formed on these films. The silicon layer constitutes the floating gates of non-volatile memory cells and the gate electrodes of MOS transistors. LOCOS may be used in place of STI.

A hard mask layer 15 such as silicon nitride is formed on the silicon layer 41, and a resist pattern 16 having each gate electrode shape is formed on the hard mask layer. This state corresponds to the state shown in FIG. 5C with the ONO film 6, 7, 8 being replaced with the tunneling oxide film 4.

By using the resist pattern 16 as an etching mask, the hard mask 15 is etched. The resist pattern 16 is thereafter removed.

Figure 8B:
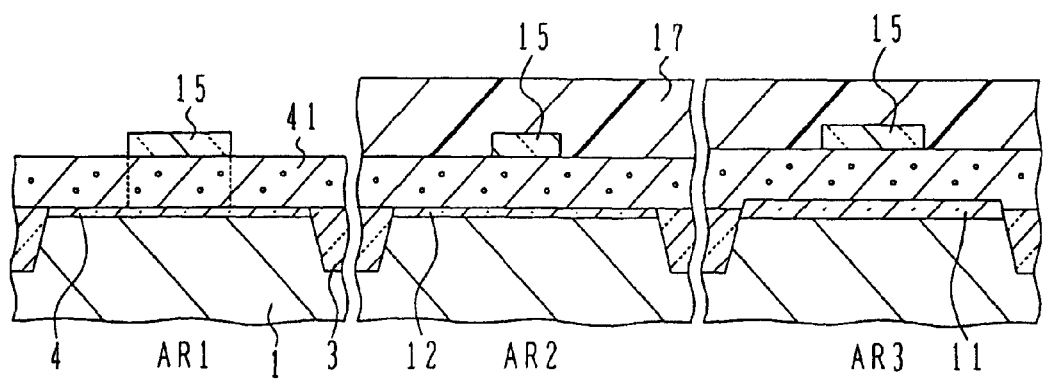

As shown in FIG. 8B, the areas AR2 and AR3 are covered with a resist mask 17, and by using the hard mask 15 as an etching mask, the silicon layer 41 in the area AR1 is etched. The resist mask 17 is thereafter removed.

Figure 8C:
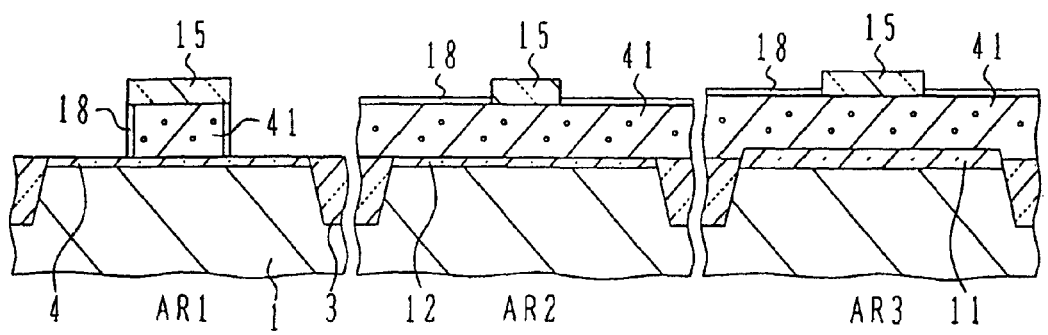

As shown in FIG. 8C, a protective oxide film 18 is formed on the side walls of the patterned silicon layer 41 in the area AR1. In the areas AR2 and AR3, the protective oxide film 18 is formed on the surface of the silicon layer 41. Thereafter, similar to the above-described embodiments, ion implantation for source/drain regions and a control gate region is performed in the non-volatile memory cell area, the silicon layer 41 in the areas AR2 and AR3 is patterned, and ion implantation for extension regions of source/drain regions is performed.

Figure 8D:
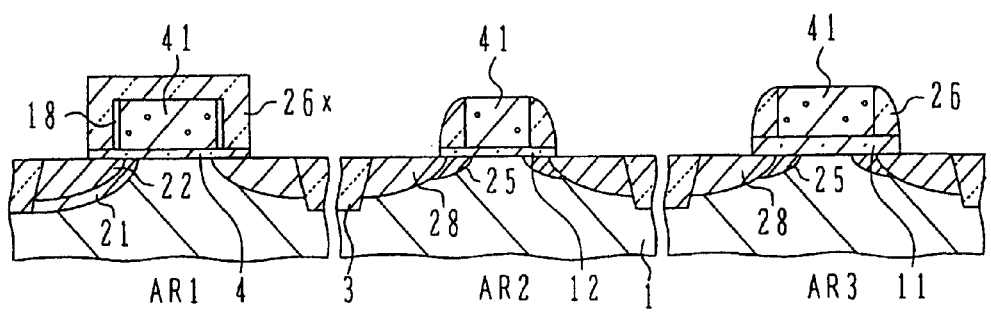

As shown in FIG. 8D, a silicon oxide film is deposited on the substrate surface. The gate electrode area in the area AR1 is covered with a mask and anisotropic etching is performed. In the areas AR2 and AR3, side wall spacers 26 are therefore formed. In the area AR1, a silicon oxide film 26x is left covering the floating gate electrode.

Thereafter, in the areas AR2 and AR3, high impurity concentration source/drain regions are formed.

Figure 8E:
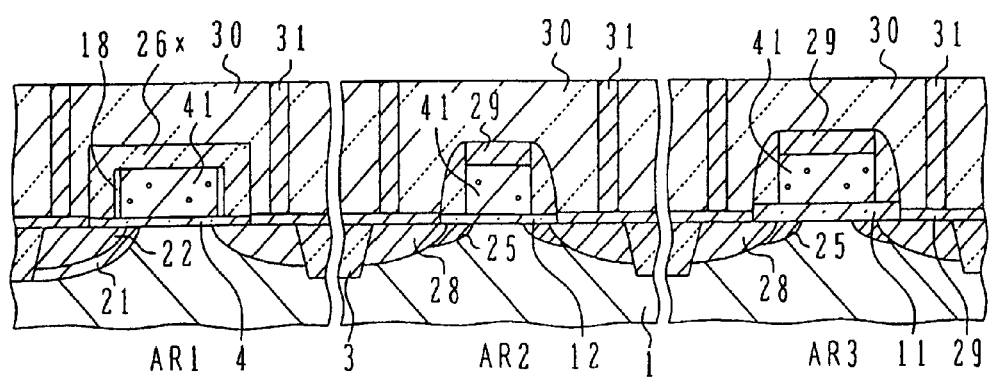

As show in FIG. 8E, a silicide layer 29 is formed on the exposed source/drain regions and gate electrodes. The gate electrode structures are covered with an interlayer insulating film 30, and W plugs 31 are buried in contact holes. A semiconductor device finished in this manner has non-volatile memory cells having the single layer gate electrode, low voltage MOS transistors and high voltage MOS transistors. Bird's beaks are not formed in the MOS transistors so that a high drive ability is maintained. A position alignment of a gate electrode mask is performed only once.

Bird's beaks may be formed under the gate electrodes of the high voltage MOS transistor.

Sixth Embodiment

FIGS. 9A to 9D illustrate a semiconductor manufacture method according to the sixth embodiment of the present invention.

Figure 9A:
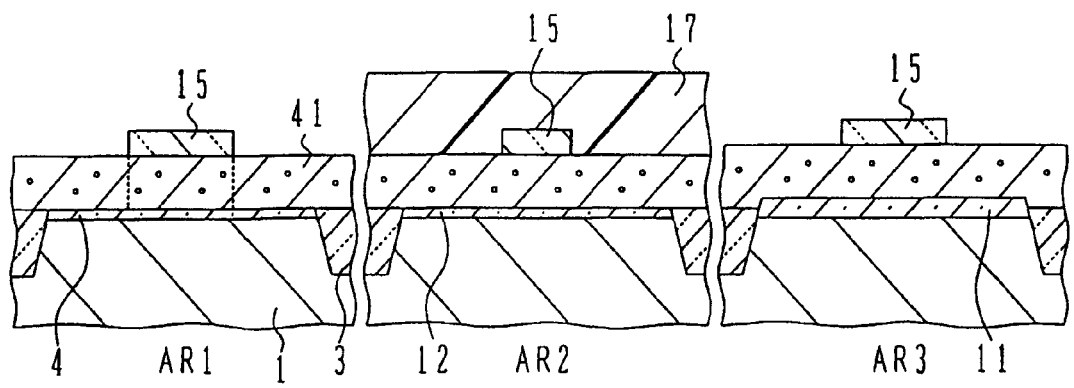
FIGS. 9A to 9D are cross sectional views illustrating main processes of a semiconductor device manufacture method according to a sixth embodiment of the present invention.

First, as shown in FIG. 9A, a hard mask pattern 15 is formed on the silicon layer 41, the area AR2 is covered with a resist mask 17, and the silicon layer 41 in the areas AR1 and AR3 is etched by using the hard mask 15 as an etching mask. The resist mask 17 is thereafter removed.

Figure 9B:
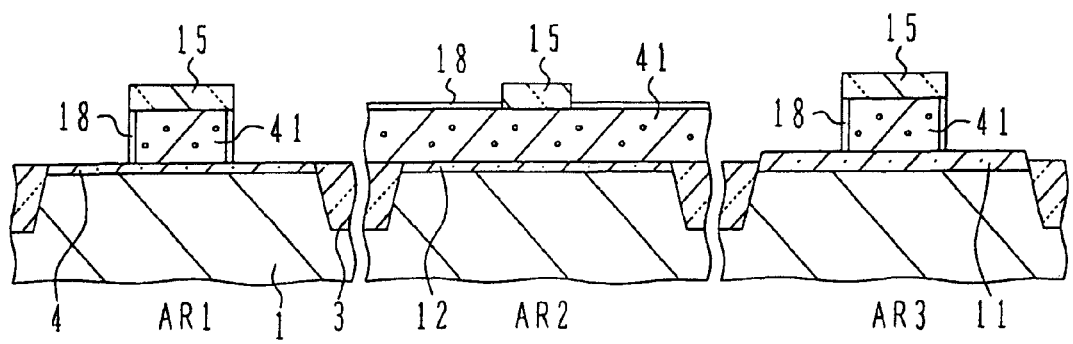

As shown in FIG. 9B, a protective oxide film 18 is formed on the side walls of the silicon layer 41 patterned in the gate electrode shape. Since the silicon layer 41 in the area AR2 is still not patterned, the oxide film 18 is formed on the surface of the silicon layer 41.

Thereafter, by covering the areas AR2 and AR3 with a resist mask, ion implantation is performed for non-volatile memory cells.

Figure 9C:
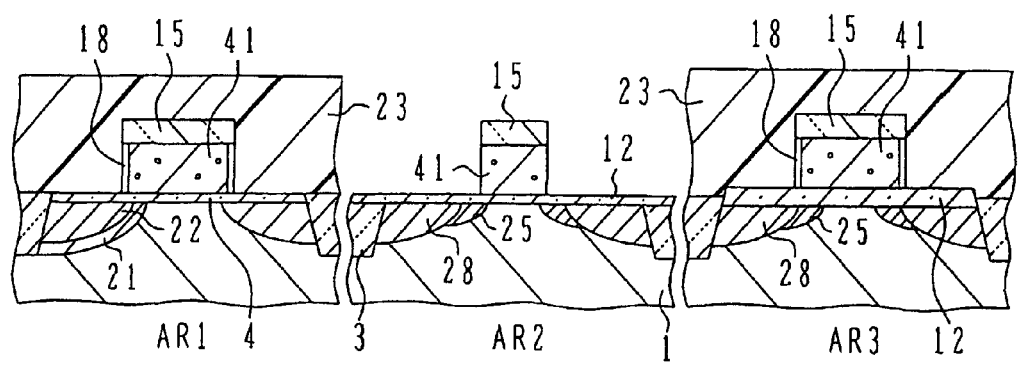

As shown in FIG. 9C, the areas AR1 and AR3 are covered with a resist mask 23, and the silicon layer 41 in the area AR2 is etched by using the hard mask 15 as an etching mask. The resist mask 23 is thereafter removed. Thereafter, by covering the area AR1 with a resist mask, ion implantation is performed for extension regions of source/drain regions in the areas AR2 and AR3.

Figure 9D:
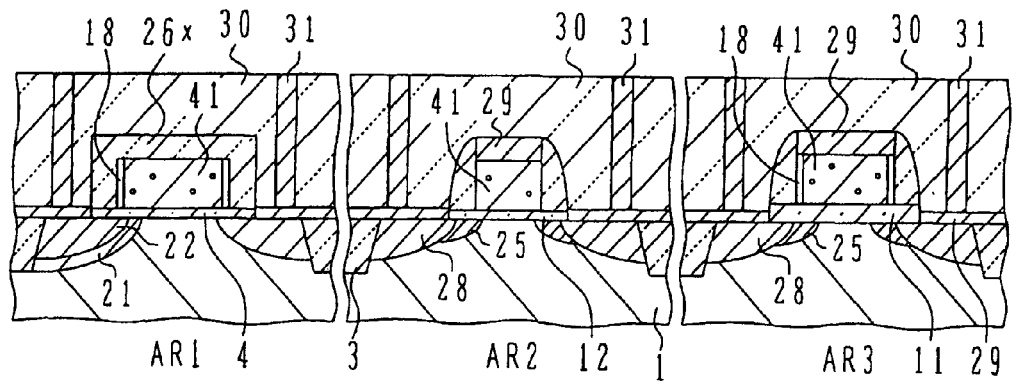

As shown in FIG. 9D, a silicide layer 29 is formed on exposed source/drain regions and exposed gate electrodes, and an interlayer insulating film 30 is formed covering the semiconductor substrate. Contact holes are formed through the interlayer insulating film 30 and W plugs 31 are buried in the contact holes.

In this embodiment, bird's beaks are formed under the gate electrode of high voltage MOS transistor to improve the breakdown voltage of the gate electrodes. Other points are similar to the fifth embodiment.

The present invention has been described in connection with the preferred embodiments. The invention is not limited only to the above embodiments. For example, various kinds of insulators may be used as the material of the hard mask layer. It will be apparent to those skilled in the art that other various modifications, improvements, combinations, and the like can be made.

It is possible to manufacture a semiconductor device such as a system LSI including non-volatile memory cells and other types of semiconductor elements.

We claim:

1. A method of manufacturing a semiconductor device comprising:
    forming, in a first region of a semiconductor substrate, a first gate insulating film over a semiconductor substrate and a first silicon layer over the first gate insulating film;
    removing the first silicon layer and the first gate insulating film outside the first region;
    forming, in a second region of the semiconductor substrate, a second gate insulating film over the semiconductor substrate;
    forming, in a third region of the semiconductor substrate, a third gate insulating film over the semiconductor substrate;
    forming, in the first region, an insulating layer over the first silicon layer;
    after forming the insulating layer, forming, in the first, second, and third regions, a second silicon layer over the semiconductor substrate;
    patterning the second silicon layer, the insulating layer and the first silicon layer in the first region to form a first gate pattern of a memory cell;
    patterning the second silicon layer in the third region to form a third gate pattern of a first transistor;
    after forming the first gate pattern and the third gate pattern, heating the semiconductor substrate in an oxidizing atmosphere to oxidize exposed surfaces of the first silicon layer and the second silicon layer of the first and third gate patterns; and
    after heating the semiconductor substrate, patterning the second silicon layer in the second region to form a second gate pattern of a second transistor.

2. The method of manufacturing the semiconductor device according to claim 1, wherein:
    the second gate insulating film is thinner than the third gate insulating film.

3. The method of manufacturing the semiconductor device according to claim 1, wherein:
    the insulating layer includes a first silicon oxide film, a silicon nitride film over the first silicon oxide film, and a second silicon oxide film over the silicon nitride film.

4. The method of manufacturing the semiconductor device according to claim 1, further comprising:
    after patterning the second silicon layer in the first, second, and third regions, forming silicide layers over the first gate pattern, the second gate pattern and the third gate pattern.

5. The method of manufacturing the semiconductor device according to claim 1, further comprising:
    forming mask patterns for first, second and third gates above the second silicon layer,
    wherein patterning the second silicon layer, the insulating layer and the first silicon layer in the first region utilizes the mask pattern for the first gate, patterning the second silicon layer in the third region utilizes the mask pattern for the third gate, and patterning the second silicon layer in the second region utilizes the mask pattern for the second gate.

6. The method of manufacturing the semiconductor device according to claim 5, wherein said semiconductor substrate is a silicon substrate, and
    the heating the semiconductor substrate forms oxide side wall spacers on the first and third gate patterns.

7. The method of manufacturing the semiconductor device according to claim 6, further comprising:
    forming second side wall spacers on the second gate pattern, and concurrently forming additional side wall spacers on the first and third gate patterns.

8. The method of manufacturing the semiconductor device according to claim 6, wherein:
    the third gate insulating film includes silicon oxide; and
    in heating the semiconductor substrate, bird's beak is formed in the third gate insulating film.

9. The method of manufacturing the semiconductor device according to claim 5, further comprising:
    after patterning the second silicon layer in the first, second, and third regions, removing the mask patterns for the first, second, and third gates, and forming silicide layers over the first gate pattern, the second gate pattern and the third gate pattern.

* * * * *